United States Patent [19]
Nakata et al.

[11] Patent Number: 5,477,438
[45] Date of Patent: Dec. 19, 1995

[54] LIGHT SOURCE UNIT EMITTING A LASER BEAM

[75] Inventors: Naotaro Nakata; Naofumi Aoki, both of Kyoto, Japan

[73] Assignees: Rohm Co., Ltd.; Dainippon Screen Mfg. Co. Ltd., both of Kyoto, Japan

[21] Appl. No.: 31,139

[22] Filed: Mar. 12, 1993

[30] Foreign Application Priority Data

Mar. 16, 1992 [JP] Japan ................................. 4-055812

[51] Int. Cl.⁶ .............................. F21K 7/00; H01S 3/08
[52] U.S. Cl. ........................ 362/259; 362/234; 372/103
[58] Field of Search ........................... 362/19, 259, 800, 362/234; 359/710, 719, 738, 939; 372/103; 313/500, 501

[56] References Cited

U.S. PATENT DOCUMENTS

| | | | |
|---|---|---|---|
| 3,558,974 | 1/1971 | Stewart | 313/500 |
| 4,185,891 | 1/1980 | Kaestner | 362/259 |
| 4,530,574 | 7/1985 | Serifres et al. | 359/710 |
| 4,690,141 | 9/1987 | Castel et al. | 362/259 |
| 4,713,579 | 12/1987 | Miura | 313/500 |
| 4,810,068 | 3/1989 | Shimazu et al. | |
| 4,998,790 | 3/1991 | Iizuka et al. | 359/207 |

FOREIGN PATENT DOCUMENTS 62-232611 10/1987 Japan .

*Primary Examiner*—Ira S. Lazarus
*Assistant Examiner*—Y. Quach
*Attorney, Agent, or Firm*—Nikaido Marmelstein Murray & Oram

[57] ABSTRACT

A light source unit of the present invention is provided with a plurality of semiconductor lasers each emitting one laser beam, a bar body to which the semiconductor lasers are attached so that p-n junctions planes of respective semiconductor lasers are arranged in the same direction, and a beam restricting plate where holes for passing a part of the beam from the semiconductor laser are formed so as to correspond to the semiconductor lasers. With this feature, a plurality of laser beams of uniform optical power can be emitted at predetermined spaces.

6 Claims, 6 Drawing Sheets

LIGHT SOURCE UNIT EMITTING A LASER BEAM

BACKGROUND OF THE INVENTION

1. Field of the Invention

The present invention relates to a light source unit emitting a laser beam for use in a laser beam printer, a laser facsimile apparatus, a laser image scanner for printing, a bar code reader, a copying apparatus or a sensor.

2. Description of the Prior Art

Light source units having semiconductor lasers are used as light emitting sources for various apparatuses such as the above-mentioned ones. For example, in an image forming apparatus such as a laser beam printer, a copying apparatus and a facsimile apparatus, a light source unit is used as an apparatus for irradiating a laser beam for forming images such as letters on an electrophotographic drum at a high speed. In an image scanner, it is used as an apparatus for irradiating a laser beam for making master film for printing. In a bar code reader and various types of sensors, it is used as an apparatus for irradiating a laser beam for obtaining information by means of reflected beams from a bar code and an object.

A well-known typical system using a light source unit of above-mentioned type is the one in which a laser beam is generated by a semiconductor laser and a lens which serves as a collimator. The laser beam is reflected by a polygonal scanner to form an image on a predetermined surface.

In such a system where only one semiconductor laser is used, as the processing speed depends on the scanning speed, and increase in the processing speed is limited.

In consideration of this problem, in order to achieve a higher processing speed, a light source unit has been proposed, which comprises a plurality of beam emitting devices including a package provided with a beam emitting chip which emits one beam. An optical system is provided for converting the laser beam emitted from the package into a parallel beam. A fixing member is provided for fixing the plurality of beam emitting devices in a predetermined arrangement. In fabricating a light source unit of this type, however, it is not easy to adjust the positions of the light emitting devices so that the parallel beams are equally spaced.

Another well-known system is the one in which a He-Ne laser or an Ar laser is used and recording is performed onto a recording vacuum cylindrical roller which rotates or a plane recording member by turning on and off the laser beam by use of an acoustooptic modulator. In order to achieve a multi channel in such an apparatus, however, a highly-accurate beam splitter for splitting one laser beam into a plurality of beams and a multi-channel acoustooptic modulator for severally modulating the plurality of beams are required. As a result, the cost increases.

In order to overcome this problem, a light source unit has been proposed in which a plate with equally spaced pinholes are formed so as to correspond to a plurality of semiconductor lasers which is used for intercepting beams other than the beams passing through the pinholes so as to equally space the parallel beams. The parallel beams can be equally spaced with this light source unit because it is easier to form pinholes so as to be equally spaced in the plate than to fix the semiconductor lasers so as to be equally spaced.

That is, although it is difficult to equally space the semiconductor lasers, it is easy to form pinholes in the plate so as to be equally spaced. By using such a beam restricting plate where pinholes are formed, equally spaced beams can be obtained even if, for example, the semiconductor lasers are not equally spaced.

In a case in which pinholes are used as described above, however, it is difficult to equalize the optical power or light quantity of each laser beam. This problem will hereinafter be explained with reference to FIGS. 4 to 6.

The cross section of a laser beam flux emitted from a semiconductor laser is not circular but elliptical. On the plate where pinholes are formed, a far field pattern (hereinafter referred to as FFP) is formed which is longer in a direction vertical to a p-n junction plane of the laser chip.

The position relations between the pinhole and the FFP can be divided into two cases, one case where the center of the FFP coincides with the center of the pinhole and another case where the FFP is decentered relative to the pinhole. As shown in FIG. 4, this decentering of the FFP can be roughly divided into a case where an FFP 10 is decentered from the center of a pinhole 25 in a direction parallel to the p-n junction plane (i.e. along the minor axis of the ellipse) and a case where the FFP 10 is decentered from the center of the pinhole 25 in a direction perpendicular to the p-n junction plane (i.e. along the major axis of the ellipse).

The degree of variation in light quantity of a beam (hereinafter referred to as pinhole beam) having passed through the pinhole 25 due to the above-mentioned decentering of the FFP from the pinhole 25 was examined by the following method with a measuring system shown in FIG. 5.

A laser diode 30 was fixed on a Z stage, and a lens 35 was fixed on a Z stage, and a plate 27 having a circular pinhole 25 was fixed on the XY stage. A plate 22 having a circular pinhole 20 with a diameter of 100 µm and a photodiode 40 were arranged at positions which are approximately one meter from the pinhole 25. The plate 22 and the photodiode 40 were fixed on an X stage, and were movable in one direction (direction of arrow A) which was perpendicular to an optical axis AX.

After the positions of the laser diode 30 and the lens 35 have been adjusted, respectively, a beam 5 was irradiated from the laser diode 30 to the pinhole 25. At this time, by moving the plate 27 in an X direction (FIG. 4) on the XY stage the pinhole 25 can be decentered, for example, from a position $1_0$ where the center of the pinhole 25 coincides with the center of FFP 10 to a position $1_1$. Similarly, by moving the plate 27 in a Y direction on the XY stage, the pinhole 25 can be decentered, for example, from the position $1_0$ to a position $1_2$. Peak powers of a pinhole beam measured by the photodiode 40 and beam diameters formed on the photodiode 40 when the position of the pinhole 25 was thus decentered are graphically shown in FIGS. 6 and 7, respectively. FIG. 6 shows measurement results corresponding to the decentering in the X direction. FIG. 7 shows measurement results corresponding to the decentering in the Y direction.

As is understood from the measurement results of FIGS. 6 and 7, the beam diameter hardly varied in either case; however, in the case of the decentering in a direction parallel to the p-n junction (FIG. 6), the peak power changed even by a slight decentering compared to the case of the decentering in a direction vertical to the p-n junction (FIG. 7).

In the conventional light source unit having a plate where pinholes are formed at equal spaces so as to correspond to the semiconductor lasers, since the p-n junction plane of each light emitting means is arranged in a random direction, according to the measurement result, a slight decentering in any direction largely changes the light quantity of some of the laser beams.

Thus, in this prior art, although it is possible to equally space the parallel beams, if the positioning accuracy of the semiconductor laser is low, it is extremely difficult to equalize the light quantity of each laser beam.

SUMMARY OF THE INVENTION

An object of the present invention is to provide a light source unit capable of emitting a plurality of parallel beams of uniform light quantity at predetermined spaces.

To achieve the above-mentioned object, a light source unit of the present invention is provided with: a plurality of semiconductor lasers each emitting one laser beam; a fixing member where the plurality of semiconductor lasers are mounted so that p-n junction planes of respective semiconductor lasers are arranged in a same direction; and a beam restricting member with a plurality of pinholes each for passing a part of the beam emitted from each of the semiconductor lasers wherein the pinholes are formed at equal distances so as to correspond to the semiconductor lasers, respectively.

With such a feature, since the FFPs, which are ellipses longer in a direction perpendicular to the p-n junction plane of the chip, of all the beams emitted from the plurality of semiconductor lasers are longer in the same direction at the beam restricting member, even if the FFPs are decentered in that direction, the variation in light quantity of the beam having passed through the pinhole due to such decentering is extremely small with respect to any of the beams having passed through the pinholes.

For example, in a case where the p-n junction plane of the chip is perpendicular to the direction in which the semiconductor lasers are arranged, the positioning accuracy of the semiconductor lasers in the direction in which the semiconductor lasers are arranged can be lower, in other words that the adjustment may not be perfect.

Hence, only by accurately positioning the semiconductor lasers in a direction parallel to the p-n junction plane of the chip, can a beam of uniform light quantity be obtained from any semiconductor lasers at any position. That is, the positioning accuracy of the semiconductor lasers can be lower without the light quantity being affected. Furthermore, parallel beams with a predetermined space therebetween are obtained, which space is the same as that between the pinholes.

BRIEF DESCRIPTION OF THE DRAWINGS

This and other objects and features of this invention will become clear from the following description, taken in conjunction with the preferred embodiments with reference to the accompanied drawings in which.

DESCRIPTION OF THE PREFERRED EMBODIMENTS

Figure 1:
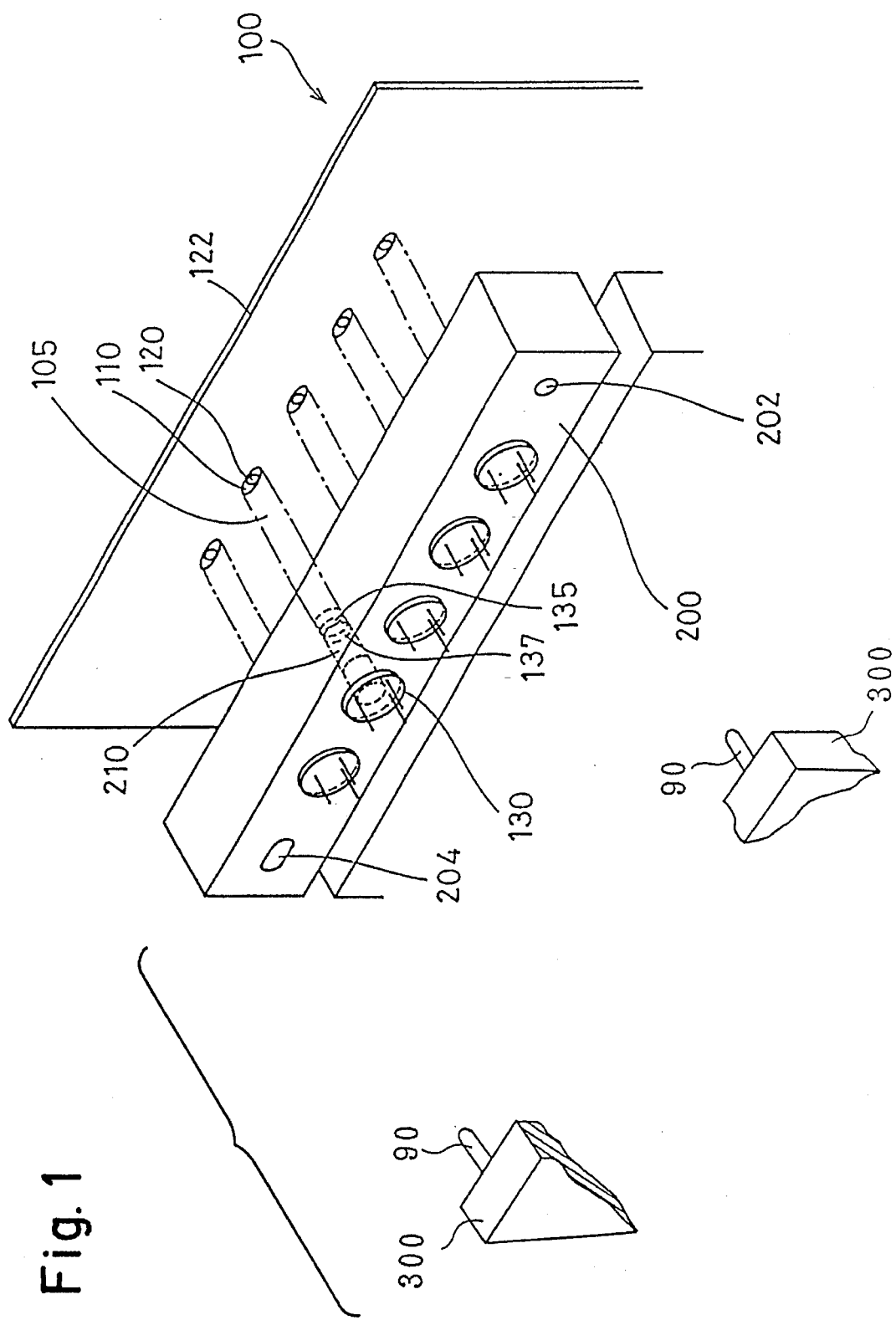
FIG. 1 is a perspective view of a principal portion of a light source unit embodying the present invention.
Figure 2:
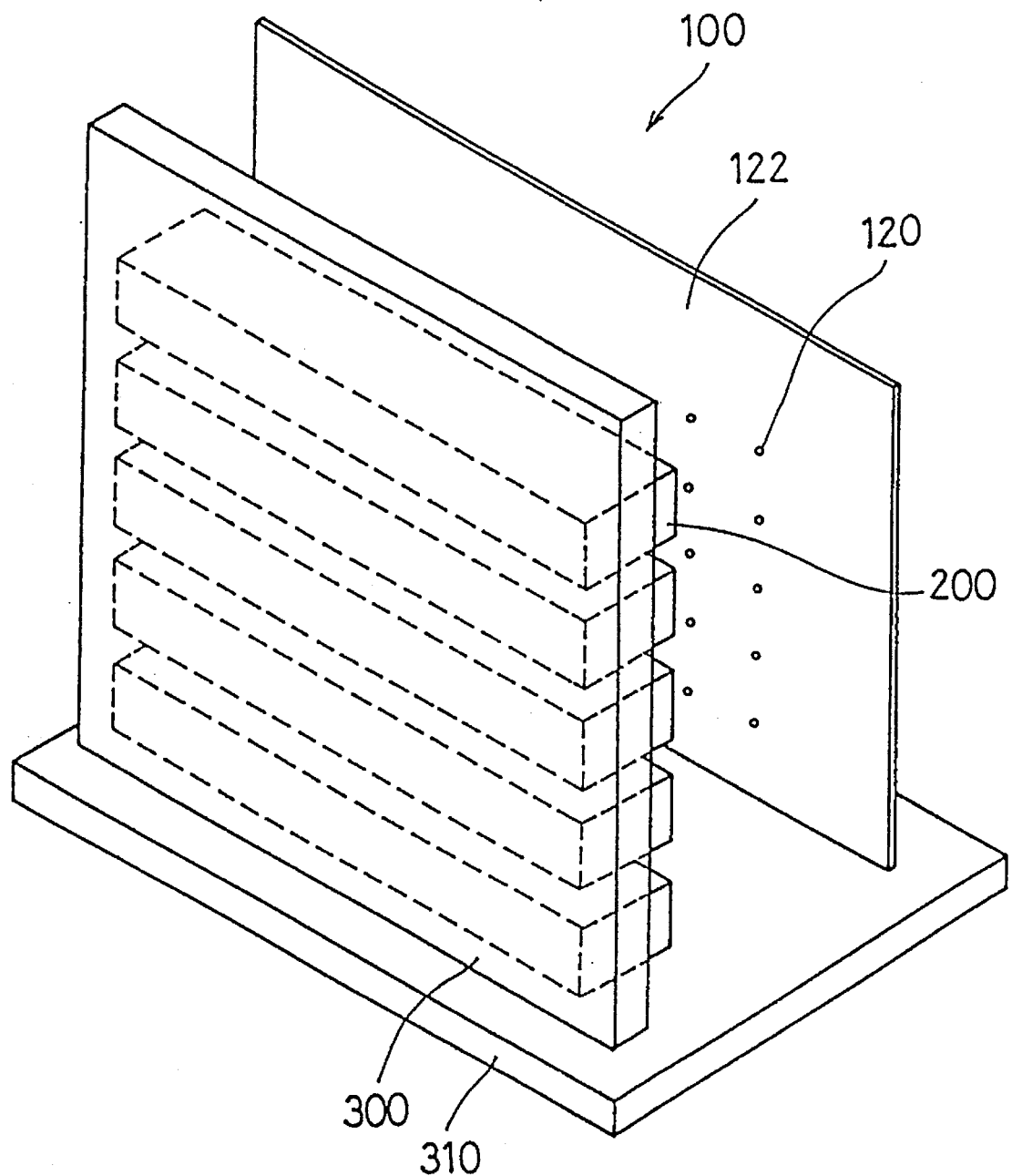
FIG. 2 is a perspective view of the light source unit embodying the present invention.
Figure 3:
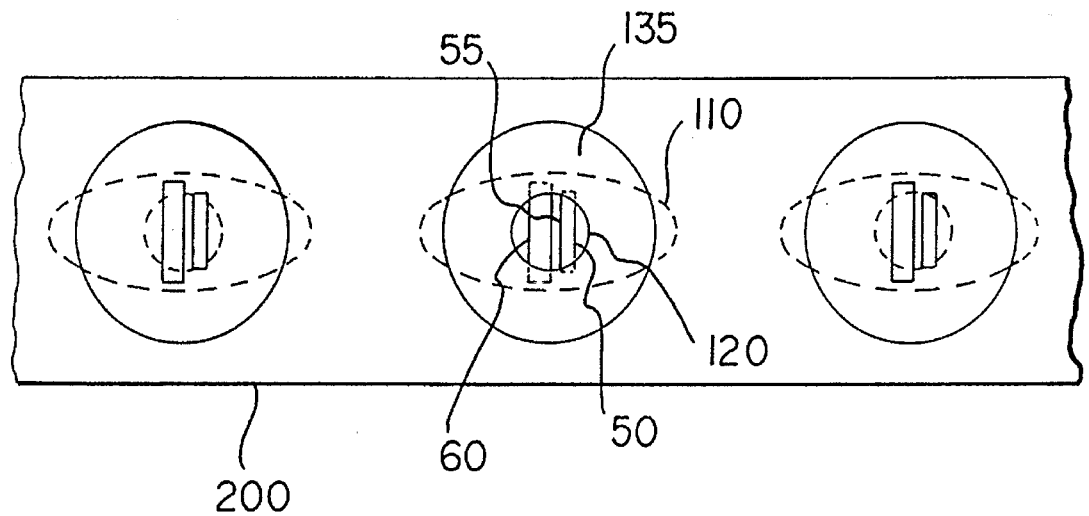
FIG. 3 is a view for explaining a position relation of an FFP and a pinhole to a p-n junction plane when a portion of one bar body is viewed from the lens side in the embodiment of the present invention.

An embodiment of the present invention will hereinafter be described with reference to the drawings. FIGS. 1 and 2 are perspective views schematically showing a principal portion arrangement and a general arrangement of this embodiment. FIG. 3 shows, in regard to one bar body 200, a position relation of an FFP 110 and a pinhole 120 to a p-n junction plane 55.

A light source unit 100 of this embodiment includes a beam emitting device, a fixing member and a beam restricting member.

The light emitting device includes a plurality of semiconductor lasers 130 (FIG. 1) each of which is provided with a laser chip 50 (FIG. 3) which emits one beam 105 (FIG. 1), and a lens 135 for converting the laser beam from the semiconductor laser 130 into a parallel beam (beam 105). The semiconductor laser 130 is provided with a photodiode for monitoring (not shown). The intensity of the laser emission is controlled by monitoring the intensity by the photodiode. The lens 135, which is fixed in a lens barrel 137, serves as a collimator.

The fixing member is a bar body 200 where the plurality of semiconductor lasers 130 and the lenses 135 are fixed in through holes 210. The semiconductor lasers 130 are arranged in a two-dimensional array form by arranging the bar body 200, where the semiconductor lasers 130 are arranged in a row as shown in FIG. 1, in a vertical direction as shown in FIG. 2.

The beam restricting member is a thin plate 122 where pinholes 120 are formed at equal spaces so as to correspond to the semiconductor lasers 130. Each pinhole 120 passes a part of the beam 105 emitted from each semiconductor lasers 130.

The bar body 200 is provided with holes 202 and 204 for receiving screws or pins 90 to indirectly fix the bar body 200 to the thin plate 122. That is, at the holes 202 and 204, the plurality of bar bodies 200 are fixed to a fixing plate 300 with pins 90 as shown in FIGS. 1 and 2. The fixing plate 300 and the thin plate 122 are fixed to a fixing plate 310 with adhesive or machine screws as shown in the figure. The fixing plates 300 and 310 and the thin plate 122 may be formed in one body. Moreover, the bar body 200 may be covered with a cover having the pinholes 120.

In FIG. 1, the arrangement inside the bar body 200 is shown only with respect to one beam emitting device including the semiconductor laser 130 and the lens 135. The inside arrangements of other beam emitting devices arranged in an array form are not shown.

In one bar body 200, as shown in FIG. 1, the plurality of semiconductor lasers 130 are fixed in a row along the length of the bar body 200. FIG. 3 shows a condition of the arrangement of FIG. 1 viewed from the lens 135 side. The p-n junction planes 55 of the laser chips 50 fixed to silicon sub-mounts 60, respectively, are all arranged so as to be vertical to the length of the bar body 200. As a result, since the FFP 110 is formed to be longer in a direction perpendicular to the p-n junction plane 55 as previously described, the major axis of the FFP 110 is in parallel with the length of the bar body 200 at each pinhole 120.

On the other hand, as shown in FIG. 1, the hole 204 of the bar body 200 is formed to be longer along the length of the bar body 200 in order to facilitate the above-mentioned fixing of the bar body 200 to the fixing plate 300. Consequently, the positioning accuracy of the semiconductor laser 130 along the length of the bar body 200 relative to the pinhole 120 deteriorates. Moreover, since errors which may be generated in mechanically forming the holes 210 are added along the length of the bar body 200, the previously-described decentering is apt to be large.

Figure 4:
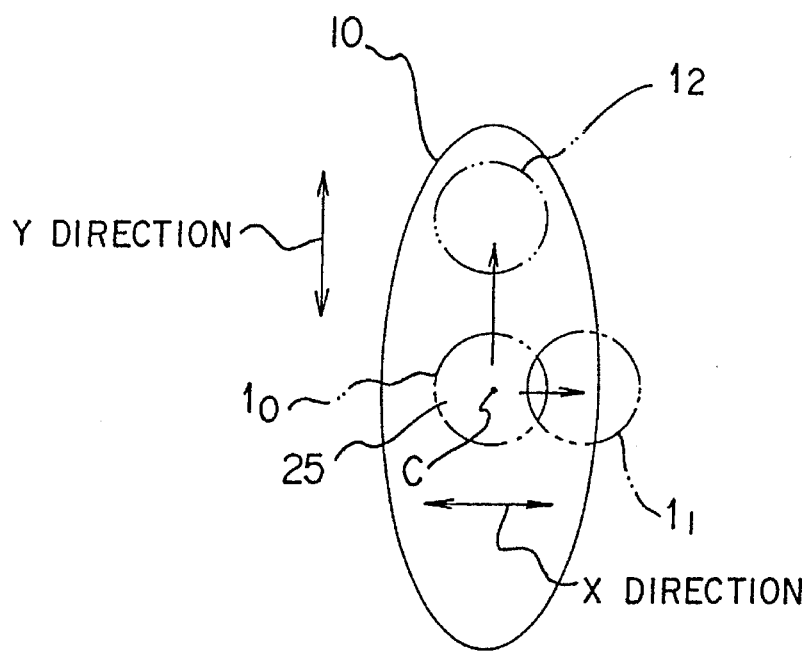
FIG. 4 is a view for explaining decentering of the FFP relative to the pinhole.
Figure 5:
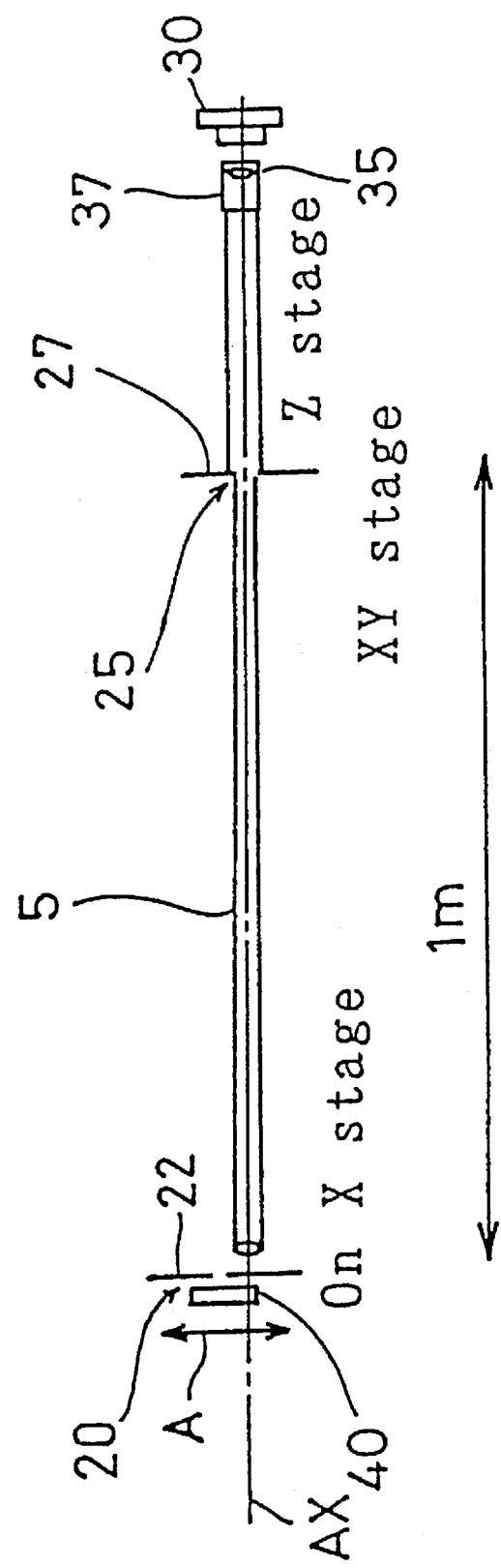
FIG. 5 is a view showing a schematic arrangement of a measuring system for measuring the optical power of a beam having passed through the pinhole when the decentering direction and decentering amount of the FFP relative to the pinhole are varied.
Figure 6:
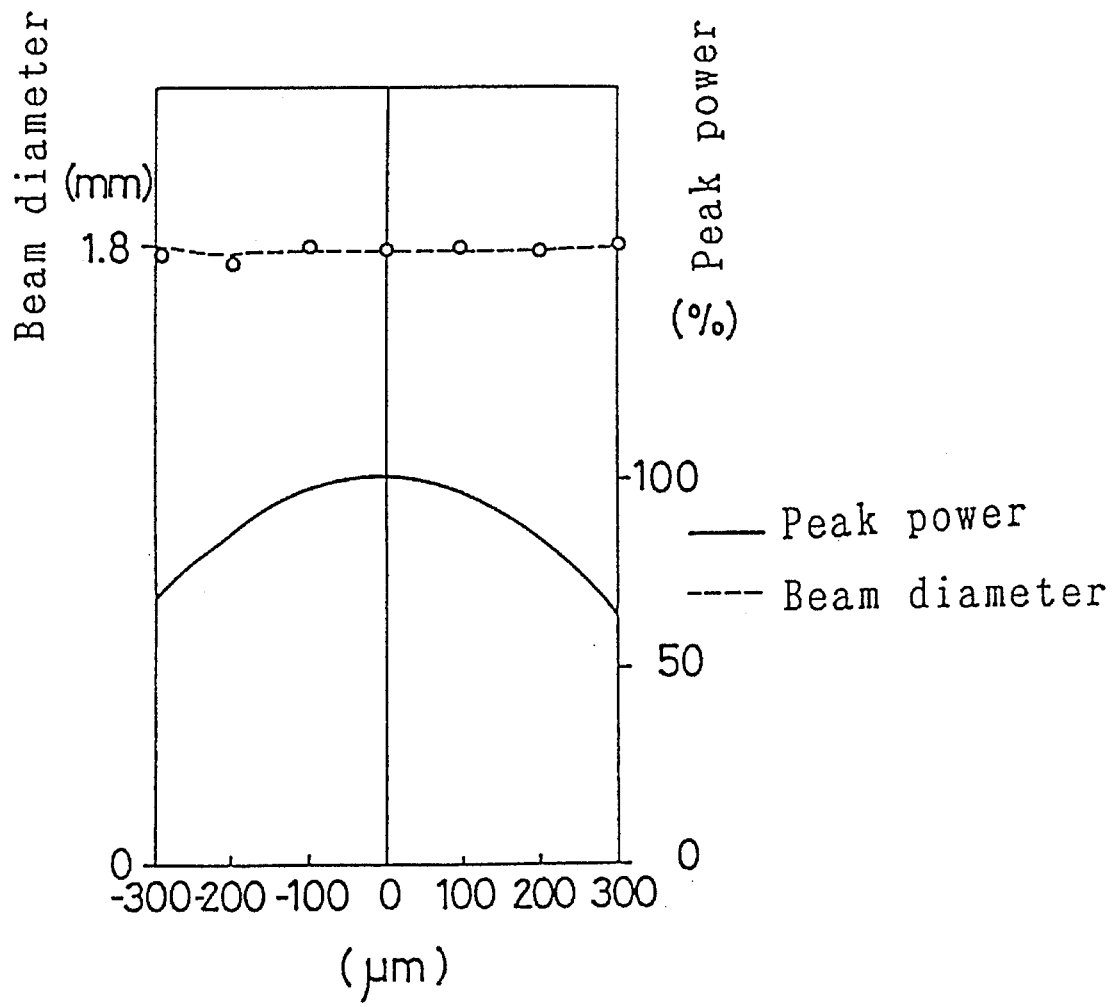
FIGS. 6 and 7 graphically show a relation between the decentering amount and the beam having passed through the pinhole with respect to different decentering directions of the FFP relative to the pinhole.
Figure 7:
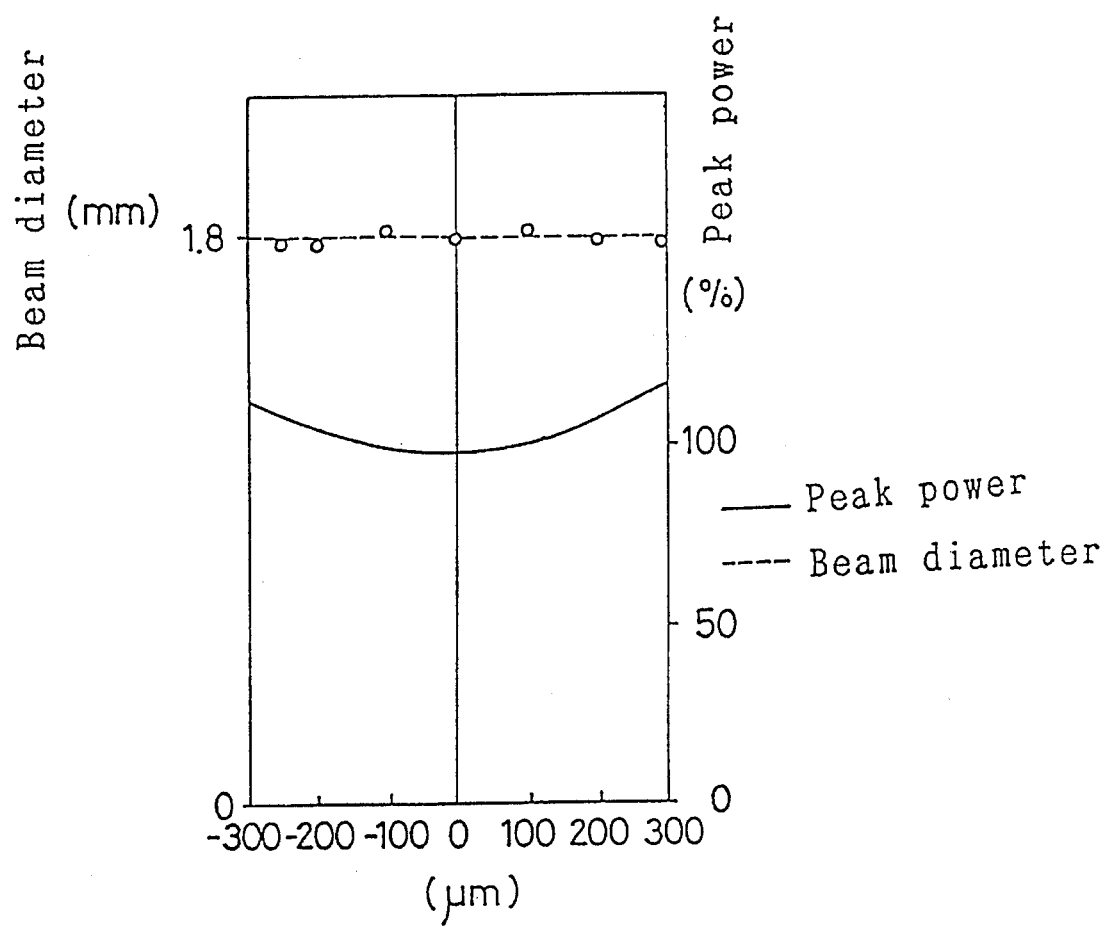

However, since the decentering along the length of the bar body 200 corresponds to the previously-described decentering in the Y direction of FIG. 4, the variation in light quantity of the pinhole beam can be restrained to be extremely small as previously described.

In this embodiment, when the FFP 110 is decentered, for example, ±0.2 mm along the width of the bar body 200 and ±0.3 mm along the length thereof, the light quantity passing through the pinhole is restrained to be within a range of ±15%. In this case, the light quantity can be equalized by adjusting each laser beam to 2.55 mW to 3.45 mW. On the other hand, if the p-n junction planes 55 of the semiconductor lasers 130 are all arranged so as to be in parallel with the length of the bar body 200, nonuniformity of the light quantity increases within a range of −30% to +10% due to the above-mentioned decentering. In this case, it is necessary to adjust each laser beam to 2.7 mW to 3.9 mW. A method in which the output of the laser is largely increased is not desirable since the lifetime of the laser is relatively shortened due to a large light quantity loss.

As described above, in this embodiment, since an array of semiconductor lasers 130, provided to one bar body 200, are arranged so that the major axis of the FFP 110 and the length of the bar body 200 coincide, only the positioning accuracy in a direction perpendicular to the length of the bar body 200 is required in fixing the semiconductor lasers 130 to the bar body 200 and fixing the bar body 200 to the fixing plate 300.

When the p-n junction planes 55 of the laser chips 50 are all arranged in one direction, which does not have to be along the length of the bar body 200, the positioning accuracy of the semiconductor lasers 130 can be lower in a direction perpendicular to the one direction. Hence, in a case where two or more arrays of semiconductor lasers 130 are provided to one bar body 200, the positioning accuracy in a direction perpendicular to the p-n junction planes can also be lower similarly to this embodiment.

According to the arrangement of this embodiment, a multi-beam scanning is enabled by using a plurality of laser beams 105 having passed through a two-dimensional pinhole array of the pinholes 120, so that the processing speed increases. Moreover, by changing the scale (e.g. the number of bar bodies 200, the number of semiconductor lasers 130 provided to one bar body 200) of the light source unit 100 at need, a desired processing speed increase rate can be achieved.

Each of the semiconductor lasers 130 independently repeats an ON/OFF operation by pulse driving. Hence, it is possible to obtain a sufficient gradation by intentionally changing the number of the semiconductor lasers 130 which are turned on. Moreover, since the characteristics of the beams 105 are uniform, one common optical system for processing the beams emitted from the light source unit 100 can be used, and compatibility can be provided as a unit. As a result, the cost is reduced, and the position adjustment, part replacement and repair can be facilitated.

Obviously, many modifications and variations of the present invention are possible in light of the above teachings. It is therefore to be understood that within the scope of the appended claims, the invention may be practiced other than as specifically described.

What is claimed is:

1. A light source unit comprising:

a plurality of semiconductor lasers each emitting one laser beam;

a fixing member where the plurality of semiconductor lasers are mounted so that p-n junction planes of respective semiconductor lasers are arranged in a same direction;

a beam restricting member where a plurality of holes each for passing a part of the beam emitted from each of the semiconductor lasers are formed at equal spaces so as to correspond to the semiconductor lasers, respectively; and a collimator lens provided so as to correspond to each of said semiconductor lasers for shaping said corresponding laser beams and wherein a part of the laser beam shaped by the collimator lens is restricted by the beam restricting member.

2. A light source unit according to claim 1, wherein the p-n junction plane is perpendicular to a direction in which the semiconductor lasers are arranged.

3. A light source unit according to claim 2, wherein the fixing member is further attached to a base plate.

4. A light source unit comprising:

a plurality of semiconductor lasers each emitting one laser beam;

a fixing member where the plurality of semiconductor lasers are mounted so that p-n junction planes of respective semiconductor lasers are arranged in a same direction;

a beam restricting member where a plurality of holes each for passing a part of the beam emitted from each of the semiconductor lasers are formed at equal spaces so as to correspond to the semiconductor lasers respectively;

wherein the p-n junction plane is perpendicular to a direction in which the semiconductor lasers are arranged; and wherein the fixing member is further attached to a base plate; and wherein the fixing member is provided with two holes each for admitting a pin for attaching the fixing member to the base plate, and one of the two holes is longer in a direction in which the semiconductor lasers are arranged.

5. A light source unit comprising:

a plurality of semiconductor lasers each emitting one laser beam;

a fixing member where the plurality of semiconductor lasers are mounted so that p-n junction planes of respective semiconductor lasers are arranged in a same direction;

a beam restricting member where a plurality of holes each for passing a part of the beam emitted from each of the semiconductor lasers are formed at equal spaces so as to correspond to the semiconductor lasers, respectively;

wherein the p,n junction plane is perpendicular to a direction in which the semiconductor lasers are arranged;

wherein the fixing member is further attached to a base plate; and wherein the fixing member is of a rectangular parallelepiped configuration where the plurality of semiconductor lasers are attached in one row, and a plurality of the fixing members are attached to the base plate.

6. A light source unit comprising:

a fixing member having a plurality of through holes formed at predetermined spaces;

a semiconductor laser whose p-n junction plane is arranged in each of the plurality of through holes so as to be perpendicular to a direction in which the through holes are arranged;

a collimator arranged in each of the through holes each for converting a laser beam from the semiconductor laser into a parallel beam; and a beam restricting member where a plurality of holes, each for passing a part of the beam, are formed so as to correspond to the through holes of the fixing member, said beam being generated from the semiconductor laser, being converted into a parallel beam and having an elliptical cross section which is shorter along the p-n junction plane and longer in a direction perpendicular to the p-n junction plane.

* * * * *